(12) United States Patent  
Zhang et al.

(10) Patent No.: US 11,081,184 B2  
(45) Date of Patent: Aug. 3, 2021

(54) METHOD OF CONCURRENT MULTI-STATE PROGRAMMING OF NON-VOLATILE MEMORY WITH BIT LINE VOLTAGE STEP UP

(71) Applicant: SanDisk Technologies LLC, Addison, TX (US)

(72) Inventors: Zhiping Zhang, San Jose, CA (US); Muhammad Masuduzzaman, San Jose, CA (US); Huai-Yuan Tseng, San Jose, CA (US); Dengtao Zhao, San Jose, CA (US); Deepanshu Dutta, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/701,450

(22) Filed: Dec. 3, 2019

(65) Prior Publication Data

US 2021/0134370 A1    May 6, 2021

Related U.S. Application Data

(63) Continuation-in-part of application No. 16/668,675, filed on Oct. 30, 2019, now abandoned.

(51) Int. Cl.
*G11C 16/12*     (2006.01)
*G11C 16/10*     (2006.01)
(Continued)

(52) U.S. Cl.
CPC ............ *G11C 16/12* (2013.01); *G11C 13/004* (2013.01); *G11C 13/0026* (2013.01);
(Continued)

(58) Field of Classification Search
CPC ...... G11C 16/10; G11C 16/24; G11C 11/4074; G11C 11/409; G11C 2216/22;
(Continued)

(56) References Cited

U.S. PATENT DOCUMENTS

| 8,837,229 | B1 | 9/2014 | Dubey et al. |
| 9,842,657 | B1 * | 12/2017 | Dutta ...................... G11C 16/26 |
| 10,643,695 | B1 * | 5/2020 | Nguyen .............. G11C 11/4091 |
| 10,706,941 | B1 * | 7/2020 | Lu ........................... G11C 16/24 |

(Continued)

OTHER PUBLICATIONS

International Search Report and Written Opinion, PCT/US2020/24399, dated Jul. 22, 2020.

*Primary Examiner* — Mushfique Siddique
(74) *Attorney, Agent, or Firm* — Dickinson Wright PLLC; Steven Hurles

(57) ABSTRACT

A method of concurrently programming a memory. Various methods include: applying a non-negative voltage on a first bit line coupled to a first memory cell; applying a negative voltage on a second bit line coupled to a second memory cell, where the negative voltage is generated using triple-well technology; then applying a programming pulse to the first and second memory cells concurrently; and in response, programming the first and second memory cells to different states. The methods also include applying a quick pass write operation to the first and second memory cells, by: applying a quick pass write voltage to the first bit line coupled to the first memory cell, where the quick pass write voltage is higher than the non-negative voltage; applying a negative quick pass write voltage to the second bit line coupled to the first memory cell, where the negative quick pass write voltage is generated using triple-well technology.

17 Claims, 11 Drawing Sheets

(51) Int. Cl.
*G11C 16/26* (2006.01)
*G11C 16/34* (2006.01)
*G11C 16/24* (2006.01)
*G11C 13/00* (2006.01)
*G11C 16/04* (2006.01)

(52) U.S. Cl.
CPC ...... *G11C 13/0069* (2013.01); *G11C 16/0483* (2013.01); *G11C 16/107* (2013.01); *G11C 16/24* (2013.01); *G11C 16/26* (2013.01); *G11C 16/34* (2013.01); *G11C 16/3404* (2013.01); *G11C 16/3427* (2013.01)

(58) Field of Classification Search
CPC ... G11C 16/12; G11C 16/0483; G11C 13/004; G11C 13/0069; G11C 16/3427; G11C 13/0026; G11C 16/3404; G11C 16/34; G11C 16/107; G11C 16/26
See application file for complete search history.

(56) References Cited

U.S. PATENT DOCUMENTS

| | | | |
|---|---|---|---|
| 10,770,165 B1* | 9/2020 | Cai | G11C 16/14 |
| 2007/0147141 A1 | 6/2007 | Shibata | |
| 2010/0232227 A1* | 9/2010 | Lee | G11C 16/3454 |
| | | | 365/185.19 |
| 2010/0265766 A1 | 10/2010 | Lue | |
| 2011/0182117 A1* | 7/2011 | Yang | G11C 16/10 |
| | | | 365/185.02 |
| 2012/0014184 A1* | 1/2012 | Dutta | G11C 16/3486 |
| | | | 365/185.19 |
| 2012/0206967 A1 | 8/2012 | Lutze et al. | |
| 2013/0294169 A1 | 11/2013 | Sharon et al. | |
| 2016/0099067 A1 | 4/2016 | Tran et al. | |
| 2016/0163395 A1* | 6/2016 | Suito | G11C 16/3445 |
| | | | 365/185.12 |
| 2019/0139609 A1* | 5/2019 | Park | G11C 16/26 |
| 2020/0013468 A1* | 1/2020 | Yoshida | G11C 16/32 |
| 2020/0043549 A1* | 2/2020 | Shibata | G11C 16/08 |

\* cited by examiner

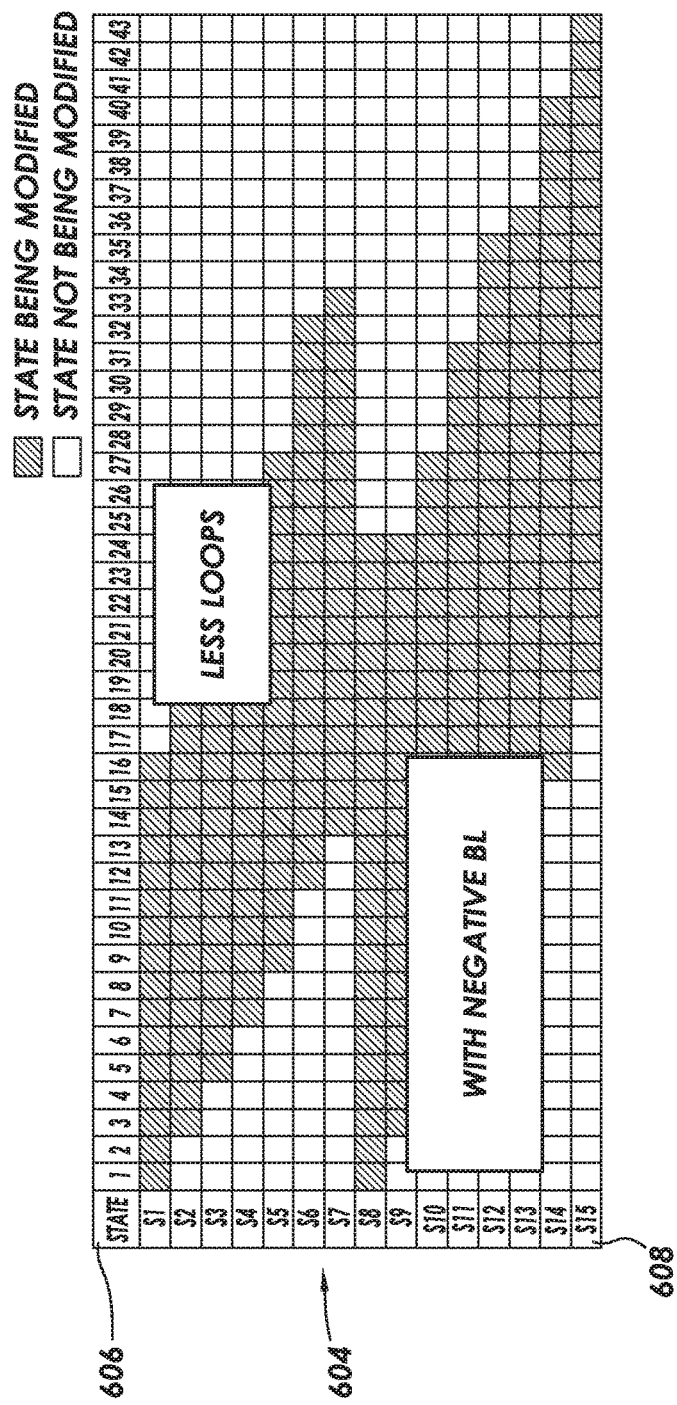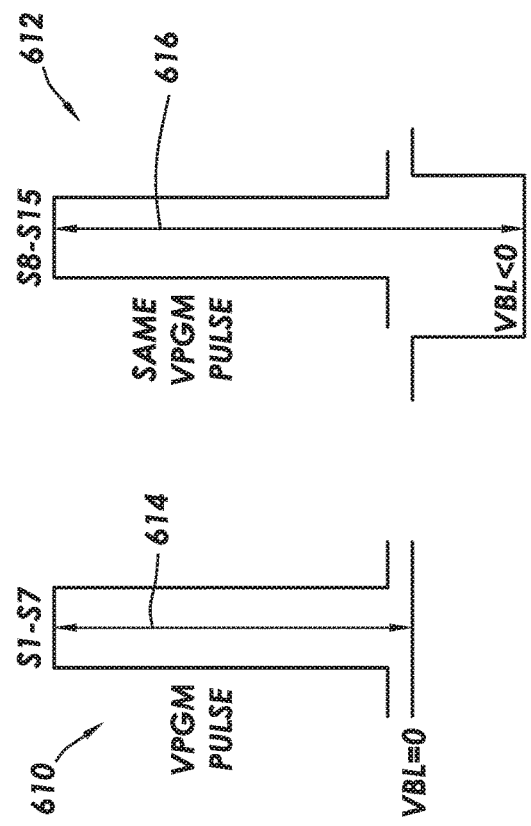
FIG. 6B

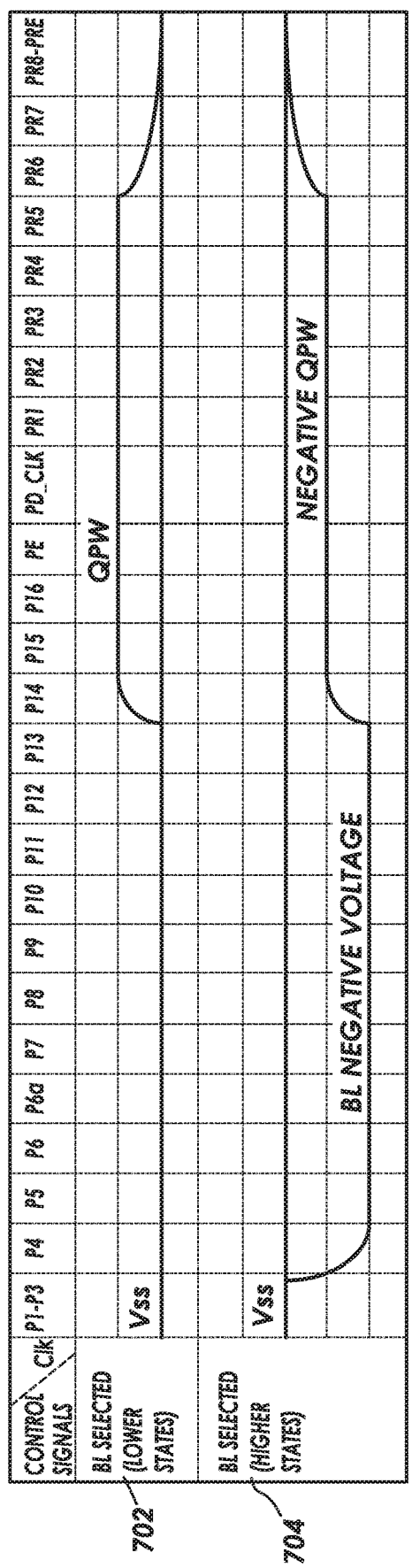

METHOD OF CONCURRENT MULTI-STATE PROGRAMMING OF NON-VOLATILE MEMORY WITH BIT LINE VOLTAGE STEP UP

CROSS REFERENCE TO RELATED APPLICATION

This Continuation-In-Part application claims the benefit of U.S. Non-Provisional patent application Ser. No. 16/668,675 filed Oct. 30, 2019. The entire disclosure of the above application is incorporated herein by reference.

BACKGROUND

Semiconductor memory is widely used in various electronic devices such as a laptop, a digital audio player, a digital camera, a cellular phone, a video game console, a scientific instrument, an industrial robot, medical electronics, a solid state drive, and a USB. Semiconductor memory includes both non-volatile and volatile memory. Non-volatile memory systems retain stored information without requiring an external power source. Examples of non-volatile memory include flash memory (e.g., NAND-type and NOR-type flash memory) and Electrically Erasable Programmable Read-Only Memory (EEPROM).

Recent trends in flash memory have included attempts to create more dense memory that is capable of holding more data while taking up less physical space. Some of the improvements have included increasing the number of states that may be stored in a single memory cell. However, the greater the number of states that can be programmed into a memory cell, the longer it may potentially take to program the memory.

SUMMARY

Various embodiments include a method for concurrently programming a memory, including: applying a non-negative voltage on a first bit line coupled to a first memory cell; applying a negative voltage on a second bit line coupled to a second memory cell, wherein the negative voltage is generated using triple-well technology; then applying a programming pulse to the first and second memory cells concurrently; and in response, programming the first and second memory cells to different states.

Other embodiments include a memory controller, including: a first terminal coupled to a memory array; the memory controller configured to: apply a non-negative voltage on a first bit line coupled to a first memory cell in the memory array; apply a negative voltage on a second bit line coupled to a second memory cell in the memory array; apply a programming pulse to the first and second memory cells concurrently; and in response, program the first and second memory cells to different states.

Additional embodiments include a non-volatile storage system, configured to concurrently program memory cells, including: a memory array including a first and second memory cells; a controller coupled to the memory array, where the controller is configured to: apply a non-negative voltage on a first bit line coupled to a first memory cell; apply a negative voltage on a second bit line coupled to the second memory cell, where the negative voltage is generated using triple-well technology; then apply a programming pulse to the first and second memory cells concurrently; and in response, program the first and second memory cells to different states.

BRIEF DESCRIPTION OF THE DRAWINGS

For a detailed description of example embodiments, reference will now be made to the accompanying drawings in which:

FIG. 6b illustrates a chart associated with programming memory cells, in accordance with some embodiments.

FIG. 7 illustrates a plot associated with a program loop, in accordance with some embodiments.

DETAILED DESCRIPTION

Figure 1:
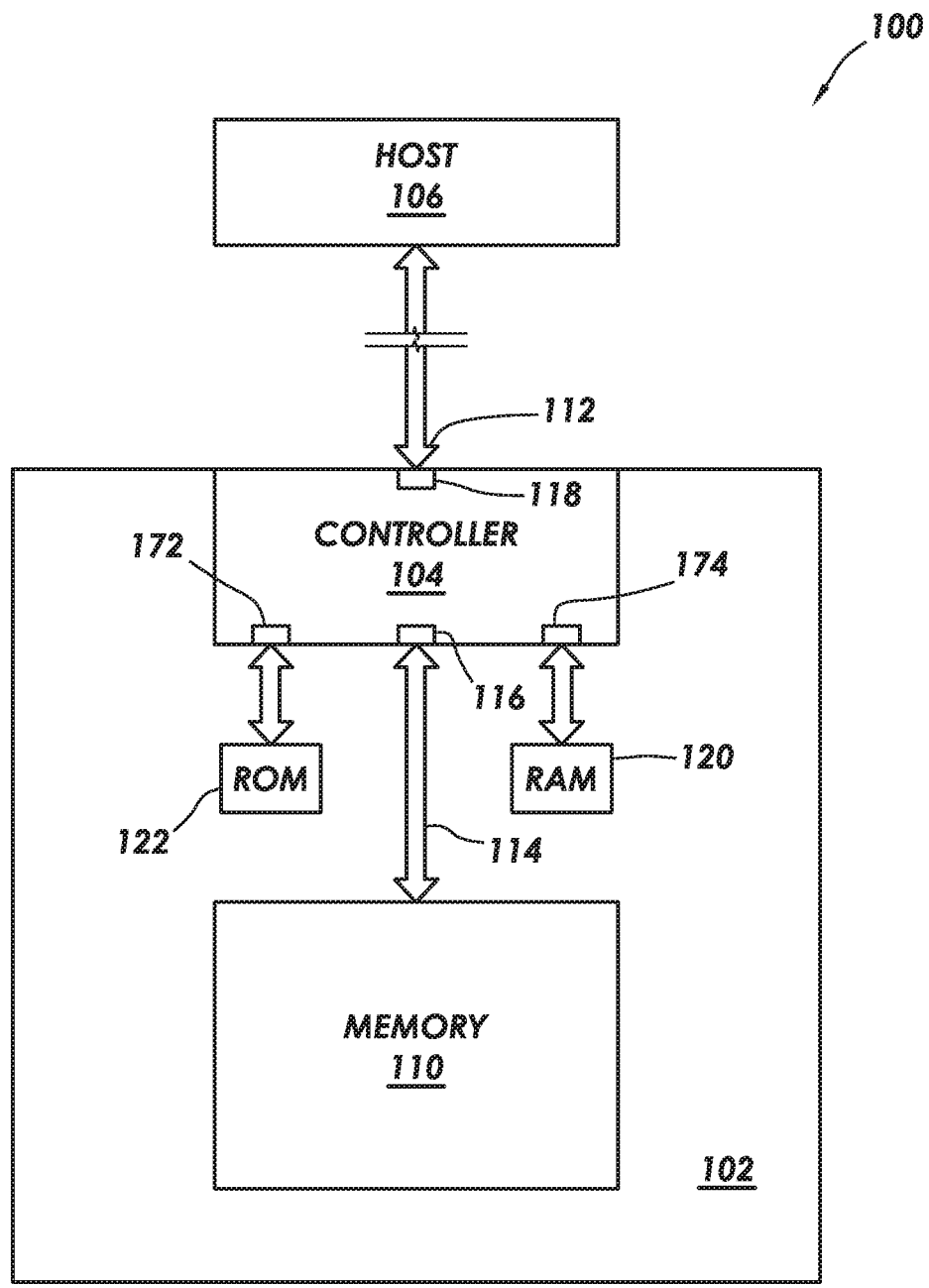
FIG. 1 illustrates a block diagram of an example non-volatile memory system, in accordance with some embodiments.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

As described herein, methods are described for concurrently programming a memory. The concurrent programming enables a controller to program two or more memory cells to different states. The method includes applying a non-negative voltage on a first bit line coupled to a first memory cell; applying a negative voltage on a second bit line coupled to a second memory cell, where the negative voltage is generated using triple-well technology; then applying a programming pulse to the first and second memory cells concurrently; and in response, programming the first and second memory cells to different states.

Thus, the methods described herein, use the same programming pulse to program two different states. One aspect that varies between the two memory cells programmed to different states, is the voltage applied to the bit lines. By applying a non-negative voltage and a negative voltage to respective bit lines, a magnitude of voltage applied to the respective memory cell is varied.

Additionally, the methods described herein further include applying a quick pass write operation to the first and second memory cells. The first memory cell which receives the non-negative voltage on the first bit line also receives a quick pass write voltage on the first bit line, where the quick pass write voltage is higher than the non-negative voltage. The second memory cell which receives the negative voltage on the second bit line receives a negative quick pass write voltage, where the negative quick pass write voltage is between the negative voltage and the non-negative voltage, and where the negative quick pass write voltage is generated using triple-well technology.

The description turns to describing an example memory system and then turns to various aspects associated with concurrently programming memory. In particular, FIGS. 1-3, and 9 describe aspects of the memory system and triple-well technology, while FIGS. 4-8 describes aspects of programming the memory.

FIG. 1 illustrates a block diagram of an example system architecture 100 including non-volatile memory "NVM" array 110 (hereinafter "memory 110"). In particular, the example system architecture 100 includes storage system 102 that further includes a controller 104 communicatively coupled to a host 106 by a bus 112. The bus 112 implements any known or after developed communication protocol that enables the storage system 102 and the host 106 to communicate. Some non-limiting examples of a communication protocol include Secure Digital (SD) protocol, Memory Stick (MS) protocol, Universal Serial Bus (USB) protocol, or Advanced Microcontroller Bus Architecture (AMBA).

The controller 104 has at least a first port 116 coupled to the memory 110 byway of a communication interface 114. The memory 110 is disposed within the storage system 102. The controller 104 couples the host 106 by way of a second port 118 and the bus 112. The first and second ports 116 and 118 of the controller can include one or several channels that couple the memory 110 or the host 106, respectively.

Additionally, the controller 104 may be coupled to a random access memory (RAM) 120 and a read only memory (ROM) 122. The RAM 120 and ROM 122 are respectively coupled to the controller 104 by a RAM port 174 and a ROM port 172. Although the RAM 120 and the ROM 122 are shown as separate modules within the storage system 102, the illustrated architecture is not meant to be limiting. For example, the RAM 120 and the ROM 122 can be located within the controller 104. In other cases, portions of the RAM 120 or ROM 122, respectively, can be located outside the controller 104. In other embodiments, the controller 104, the RAM 120, and the ROM 122 are located on separate semiconductor die.

The memory 110 of the storage system 102 includes several memory die. The manner in which the memory 110 is defined in FIG. 1 is not meant to be limiting. In some embodiments, the memory 110 defines a physical set of memory die. In other embodiments, the memory 110 defines a logical set of memory die, where the memory 110 includes memory die from several physically different sets of memory die. A memory die includes non-volatile memory cells that retain data even when there is a disruption in the power supply. Thus, the storage system 102 can be easily transported and the storage system 102 can be used in memory cards and other memory devices that are not always connected to a power supply.

In various embodiments, the memory cells in the memory die are solid-state memory cells (e.g., flash), one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). Furthermore, the memory cells can use charge-trapping technology to store data.

Still referring to FIG. 1, the controller 104 and the memory 110 are communicatively coupled by an interface 114 implemented by several channels (e.g., physical connections) disposed between the controller 104 and the individual memory die 110-1-110-N. The depiction of a single interface 114 is not meant to be limiting as one or more interfaces can be used to communicatively couple the same components. The number of channels over which the interface 114 is established varies based on the capabilities of the controller 104. Additionally, a single channel can be configured to communicatively couple more than one memory die. Thus the first port 116 can couple one or several channels implementing the interface 114. The interface 114 implements any known or after developed communication protocol. In embodiments where the storage system 102 is flash memory, the interface 114 is a flash interface, such as Toggle Mode 200, 400, or 800, or Common Flash Memory Interface (CFI).

In various embodiments, the host 106 includes any device or system that utilizes the storage system 102—e.g., a computing device, a memory card, a flash drive. In some example embodiments, the storage system 102 is embedded within the host 106—e.g., a solid state disk (SSD) drive installed in a laptop computer. In additional embodiments, the system architecture 100 is embedded within the host 106 such that the host 106 and the storage system 102 including the controller 104 are formed on a single integrated circuit chip. In embodiments where the system architecture 100 is implemented within a memory card, the host 106 can include a built-in receptacle or adapters for one or more types of memory cards or flash drives (e.g., a universal serial bus (USB) port, or a memory card slot).

Although, the storage system 102 includes its own memory controller and drivers (e.g., controller 104)—as will be described further below in FIG. 9—the example described in FIG. 1 is not meant to be limiting. Other embodiments of the storage system 102 include memory-only units that are instead controlled by software executed by a controller on the host 106 (e.g., a processor of a computing device controls—including error handling of—the storage unit 102). Additionally, any method described herein as being performed by the controller 104 can also be performed by the controller of the host 106.

Still referring to FIG. 1, the host 106 includes its own controller (e.g., a processor) configured to execute instructions stored in the storage system 102 and further the host 106 accesses data stored in the storage system 102, referred to herein as "host data". The host data includes data originating from and pertaining to applications executing on the host 106. In one example, the host 106 accesses host data stored in the storage system 102 by providing a logical address to the controller 104 which the controller 104 converts to a physical address. The controller 104 accesses the data or particular storage location associated with the physical address and facilitates transferring data between the storage system 102 and the host 106.

In embodiments where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104). Furthermore, the controller 104 can concurrently program memory cells in the memory 110 as described herein. Thus, the controller 104 performs various memory management functions such as concurrent programming (as described herein), wear leveling (e.g., distributing writes to extend the lifetime of the memory blocks), garbage collection (e.g., moving valid pages of data to a new block and erasing the previously used block), and error detection and correction (e.g., read error handling).

The technology described herein can also be utilized with technologies in addition to the charge trapping and floating gate flash memory described herein. For example, in addition to flash memory (e.g., 2D and 3D NAND-type and NOR-type flash memory), examples of non-volatile memory include ReRAM memories, magnetoresistive memory (e.g., MRAM), and phase change memory (e.g., PCRAM). A person of ordinary skill in the art will recognize that this technology is not limited to a single specific memory structure, but covers many relevant memory structures within the spirit and scope of the technology as described herein and as understood by one of ordinary skill in the art.

Figure 2:
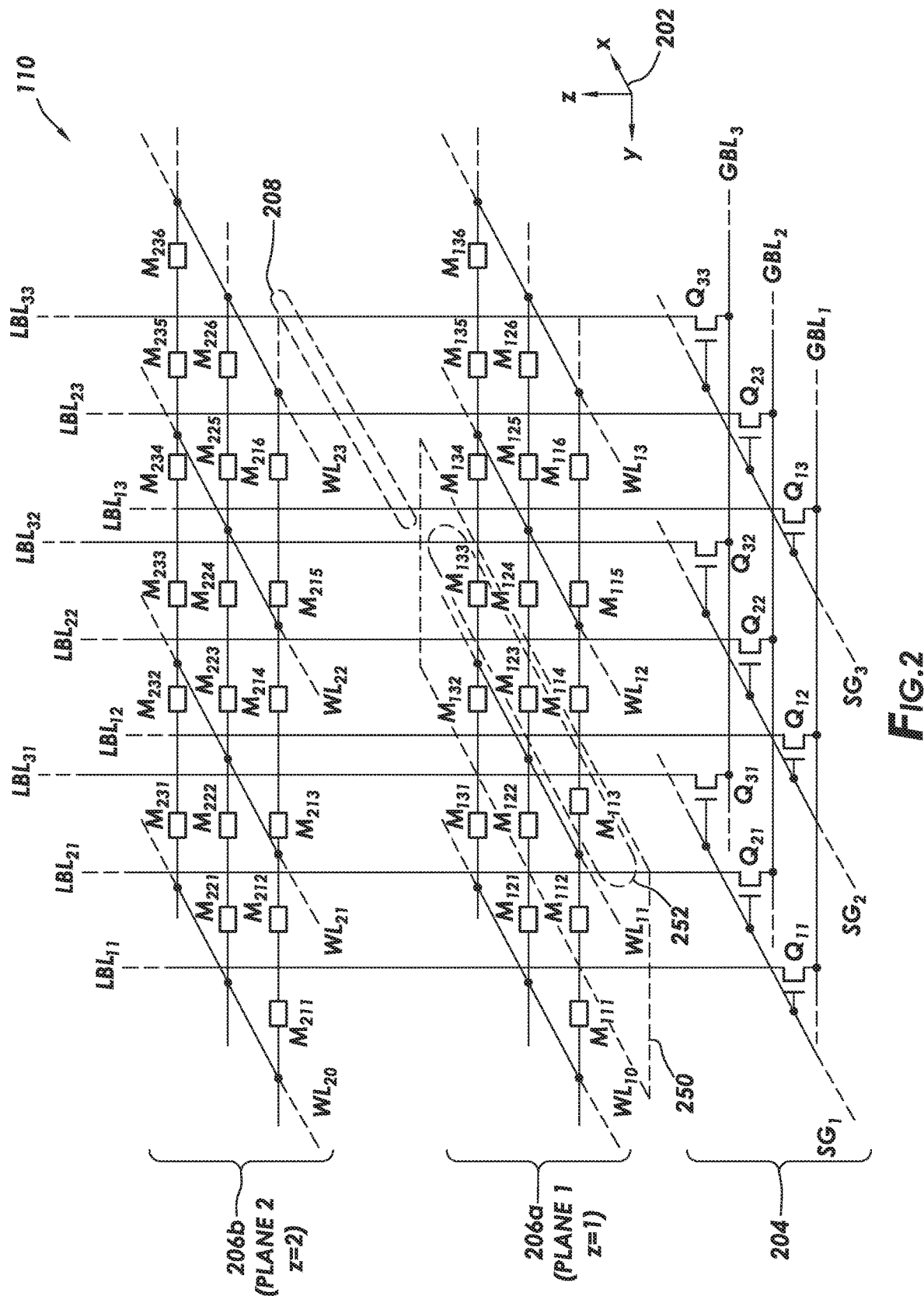
FIG. 2 illustrates an example architecture on an example three-dimensional memory, in the form of an equivalent circuit of a portion of such memory, in accordance with some embodiments.
Figure 3:
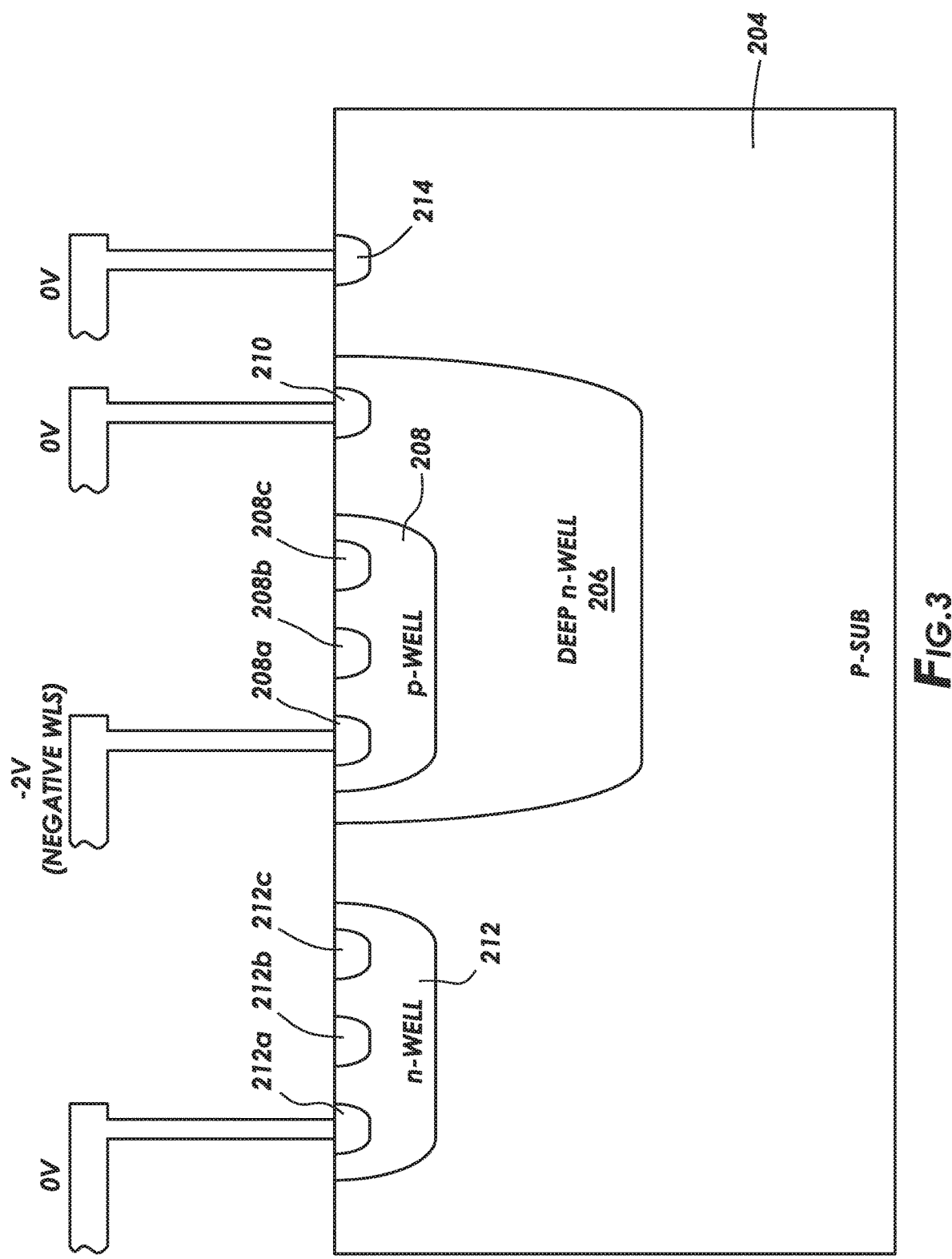
FIG. 3 illustrates a block diagram of an example triple-well technology, in accordance with some embodiments.

Additional details of the memory 110 are described next in FIGS. 2 and 3. Specifically, FIG. 2 illustrates an architecture of a three-dimensional memory in schematic form of an equivalent circuit of a portion of memory 110. A coordinate system 202 is used for reference, where the directions for vectors x, y, and z are illustrated. Each of the vectors x, y, and z are orthogonal with the other two.

The three-dimensional memory includes a substrate layer 204, and one or more planes of memory 206a and 206b. The substrate layer 204 may define one or more circuits for selectively connecting internal memory elements with external data circuits.

Each of the planes of memory 206 includes several memory storage elements $M_{zxy}$. In particular, the substrate layer 204 includes a two-dimensional array of selecting devices or switches $Q_{xy}$, where x defines a relative position of the device in the x-direction and y defines a relative position of the device in the y-direction. In one embodiment, the individual devices $Q_{xy}$ are select gates or select transistors.

Global bit lines ($GBL_x$) are elongated in the y-direction and each $GBL_x$ is disposed in different positions in the x-direction that are indicated by the subscript. Each of the global bit lines ($GBL_x$) is selectively coupled to a respective selecting devices $Q_{xy}$, where a selecting device $Q_{xy}$ shares the same position in the x-direction as the respective global bit line ($GBL_x$) that it couples. As illustrated in FIG. 2, multiple selecting devices $Q_{xy}$ are coupled to a respective global bit line ($GBL_x$) along the y-direction.

Each of the selecting devices $Q_{xy}$ selectively couples a respective local bit line ($LBL_{xy}$). The local bit line ($LBL_{xy}$) are elongated vertically, in the z-direction, and form a regular two-dimensional array in the x (row) and y (column) directions. For purposes of this discussion, a set of local bit lines ($LBL_{xy}$)—e.g., the set 208 of $LBL_{x3}$ is defined as a group of local bit lines ($LBL_{xy}$) coupling respective global bit lines ($GBL_x$) in the x-direction.

Each of the sets of $LBL_{xy}$ is selectively coupled to a respective control or select gate lines ($SG_y$). For example, the set 208 of $LBL_{x3}$ is coupled to the select gate line $SG_3$. Each of the select gate lines ($SG_y$) is elongated in the x-direction and selectively couples a corresponding set of local bit lines ($LBL_{xy}$) to the global bit line ($GBL_x$).

In various embodiments, during reading or programming, only one select device $Q_{xy}$ is turned on at a time. Accordingly, during a reading or programming, one row or local bit lines ($LBL_{xy}$) of a set of $LBL_{xy}$ is coupled to a global bit line ($GBL_x$). During an example read or program operation, the select device $Q_{13}$ receives a voltage that makes the select device $Q_{13}$ conductive. The other select devices $Q_{23}$ and $Q_{33}$ receive voltages such that the select device $Q_{23}$ and $Q_{33}$ remain non-conductive. Thus, in this example, the global bit line ($GBL_1$) couples the local bit line ($LBL_{13}$) by way of the select device $Q_{13}$. In some embodiments, as one select device ($Q_{xy}$) is used with each of the local bit line ($LBL_{xy}$), the pitch of the array across the semiconductor substrate in both x and y-directions is made very small, and thus the density of the memory storage elements is increased.

Still referring to FIG. 2, the memory storage elements $M_{zxy}$ are formed in a plurality of planes positioned at different distances in the z-direction above the substrate 204. For purposes of this discussion, two planes 206a and 206b are illustrated in the portion of memory 110. Plane 206a is disposed along the x-y plane having a value in the z-direction of 1. Plane 206b is similarly disposed along the x-y plane having a value in the z-direction of 2.

In each of the planes 206, word-line $WL_{zy}$ are elongated in the x-direction and spaced apart in the y-direction between the local bit lines ($LBL_{xy}$). Individual word-lines $WL_{zy}$ may physically be made up of one continuous material that is coupled to several different memory elements $M_{zxy}$. And individual memory elements $M_{zxy}$ are accessed by way of one local bit line ($LBL_{xy}$) and a word-line ($WL_{zy}$). As used herein, memory elements may also be referred to as memory cells or cells. A memory element $M_{zxy}$ is addressable by placing proper voltages on the local bit line ($LBL_{xy}$) and word-line ($WL_{zy}$) that couples the memory element $M_{zxy}$. During a program operation, voltages are applied that provide an appropriate amount of electrical stimulus that causes the state of the memory element to change to a desired value.

In various embodiments, each plane 206 is formed of at least two layers, one is a conductive layer that defines a word-line ($WL_{zy}$), and the second is a dielectric layer that electrically isolates the planes 206 from each other. The combined two layers is referred to as a word-line pitch. Additional layers may be present in each plane.

The planes 206 are stacked vertically on top of the substrate 204 layer, where each of the local bit lines ($LBL_{xy}$) extends perpendicular to each of the planes 206 to connect respective memory elements $M_{zxy}$ in each of the planes 206.

In FIG. 2, in various embodiments, a memory block is defined by a group of memory elements $M_{zxy}$. In one example, a block of memory is the smallest unit of memory elements $M_{zxy}$ that can be erased together. In one example, a memory block includes the memory elements $M_{zxy}$ coupled on either side of one word-line, or a portion of a word-line in scenarios where word-lines are segmented. In FIG. 2, an example memory block 250 includes the memory elements $M_{zxy}$ coupled on either side, to the word-line $WL_{11}$, and includes the memory elements $M_{132}$, $M_{122}$, $M_{112}$, $M_{133}$, $M_{123}$, and $M_{113}$.

Additionally, in some embodiments, a memory page is defined as the memory elements $M_{zxy}$ along one side of a word-line. In FIG. 2, an example memory page 252 is defined as the memory elements along one side of the word-line $WL_{11}$, and includes the memory elements $M_{133}$, $M_{123}$, and $M_{113}$.

In accordance with some embodiments herein, during a programming operation, a bit line (e.g., a local bit line) or a word-line can be coupled to a negative voltage. FIG. 3 illustrates, in block diagram form, triple-well technology implemented to generate negative voltages. In some embodiments, the substrate 204 defines a P conductivity type silicon—e.g., p-substrate 204. The p-substrate 204 defines various regions including the deep n-well 206. The deep n-well 206, in turn, defines the p-well 208 with three regions 208a, 208b, and 208c. The deep n-well 206 defines an additional region 210. In some examples, the region 208a is a P-type region.

The p-substrate 204 additionally defines an n-well region 212. The n-well region 212 defines three regions 212a, 212b, and 212c. Additionally, the p-substrate 204 defines a well region 214. As shown, the well region 212a couples a line with 0 voltages, the well region 208a couples a line with −2 voltages, the region 210 couples a line with zero voltages, and the region 214 couples a line with zero voltages.

In accordance with various embodiments described herein, a method of concurrently programming a memory includes applying a negative voltage to a bit line. The negative voltage is generated using triple-well technology as described in FIG. 3, in contrast to generated by a circuit that produces the negative voltage.

Figure 4A:
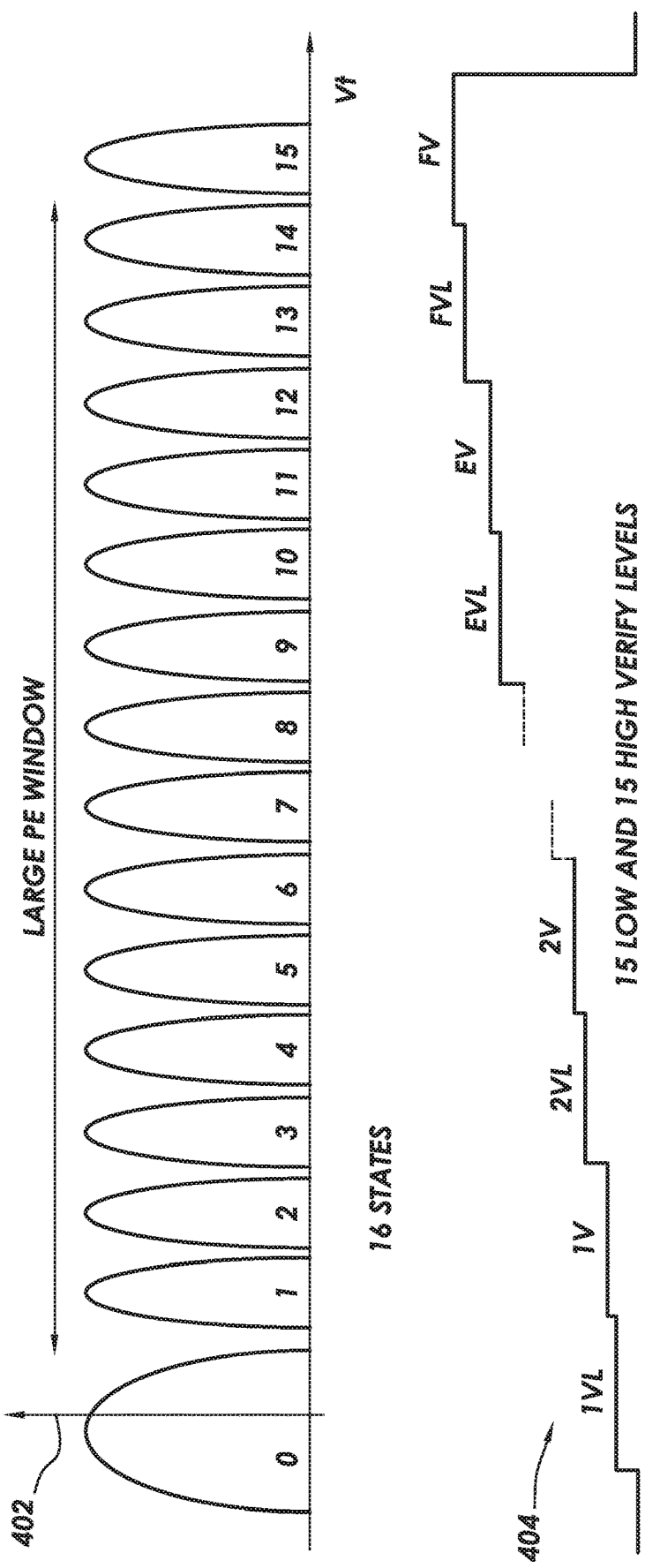
FIG. 4a illustrates a plot associated with programming memory cells where memory cells are not concurrently programmed, in accordance with some embodiments.
Figure 4B:
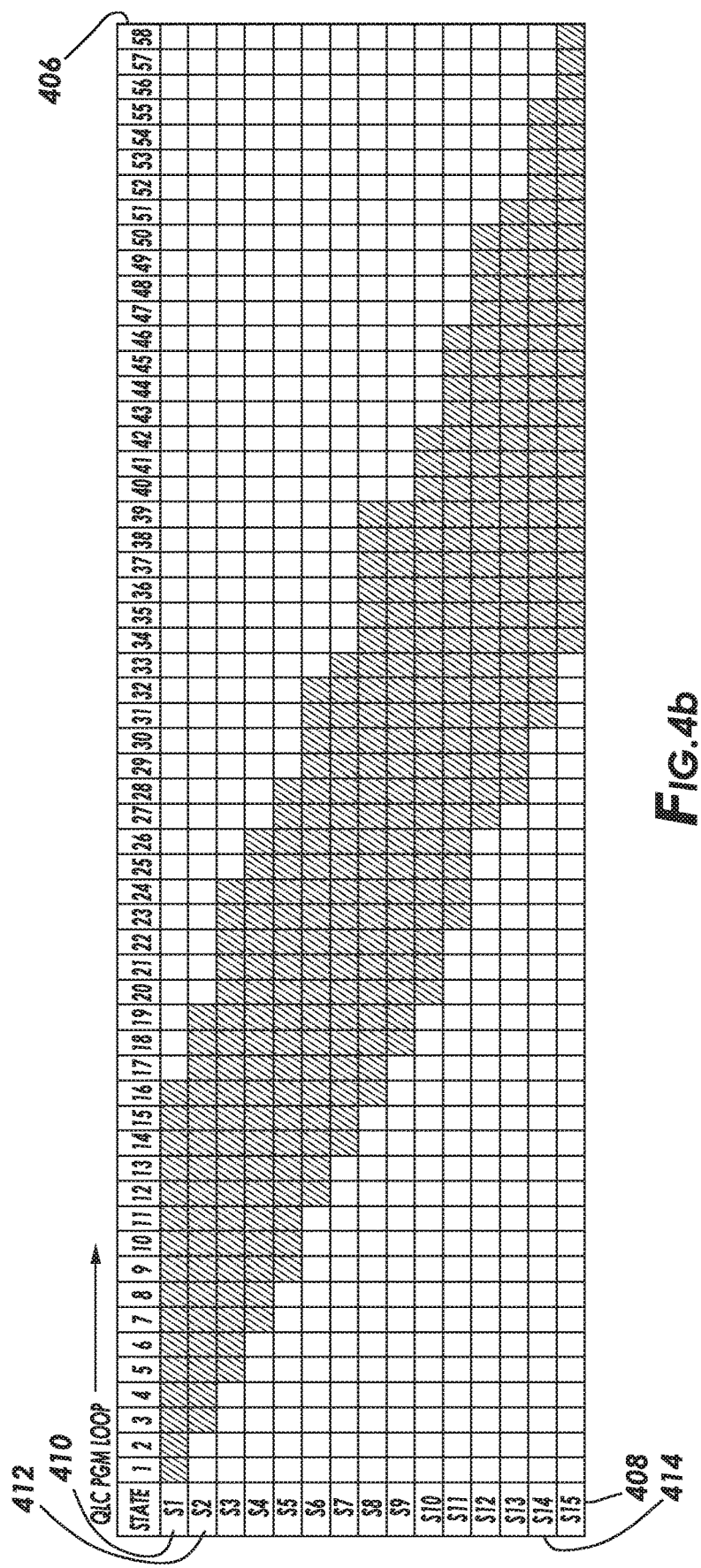
FIG. 4b illustrates a chart associated with programming memory cells where memory cells are not concurrently programmed, in accordance with some embodiments.

In FIGS. 4a and 4b, a method of programming memory cells where memory cells are not concurrently programmed is described. In the example shown in FIG. 4a, a quad level cell (QLC) can be programmed to sixteen different states. The voltage diagram 402 illustrates threshold voltages along the x-axis and a quantity of cells along the y-axis.

The diagram 402 captures the respective binomial distribution curves for sixteen states. The state "0" includes memory cells having threshold voltages that range between negative voltages and positive voltages. The state "1" includes memory voltages having threshold voltages that are positive, where the range for the state "1" is along voltages that are higher than the memory cells programmed to the "0" state. Each of the states "2", "3", "4", etc. are defined such that the threshold voltages for each of the states fall within distinct binomial distributions that fall along the positive x-axis.

In FIG. 4a, the plot 404 illustrates the various verify levels used to verify that a memory cell is programmed to the correct level. Each of the states can be associated with two verify levels. For example, two verify levels may be used to verify that a memory cell is programmed to the state "1". The two verify levels can include a low verify level and a high verify level (e.g., 1 VL and 1V).

FIG. 4b illustrates, in a chart, an example number of program loops that may be used to program a memory having quad-level cells, where respective quad-level cells can be programmed to fifteen different states. The chart captures a number of program loops along the top row 406 of the chart. The chart captures a respective state along the first column 408 of the chart.

As illustrated in the chart, when a memory is not programmed using concurrent programming as described herein, a controller may use up to 58 program loops to program the memory. For example, the row 410 demonstrates the number of program loops used by the controller to program memory cells to the state "1". Different memory cells program at different rates. Thus, faster memory cells may program to state "1" after one program loop while slower memory cells may program to state "1" after fifteen or sixteen program loops.

The row 412 demonstrates the number of program loops used by the controller to program memory cells to the state "2". As shown in the row 412, the controller may use between three and nineteen program loops to program a memory cell to the state "2". The difference in number of program loops is attributable to the fact that memory cells program at different speeds.

The row 414 demonstrates the number of program loops used by the controller to program memory cells to the state "15". As shown in the row 414, the controller may use between 34 and 58 program loops to program a memory cell to the state "15". Accordingly, to program the memory having quad-level cells—where a respective quad-level cell can be programmed to fifteen different states, a controller may use up to 58 program loops.

With the advent of triple-well technology, some memory cells can be programmed such that negative threshold voltages are associated with states. Thus, the number of states that can be programmed in a memory cell increases. As the number of states that a memory cell can be programmed to increases, programming a memory cell in the manner described in FIGS. 4a and 4b can become time consuming.

In accordance with embodiments described herein, the time consuming aspects of programming memory—where each of the memory cells is capable of being programmed to multiple states—is reduced using methods that concurrently program the memory cells. For example, FIG. 5 illustrates an example program loop in which memory cells are programmed concurrently.

Figure 5:
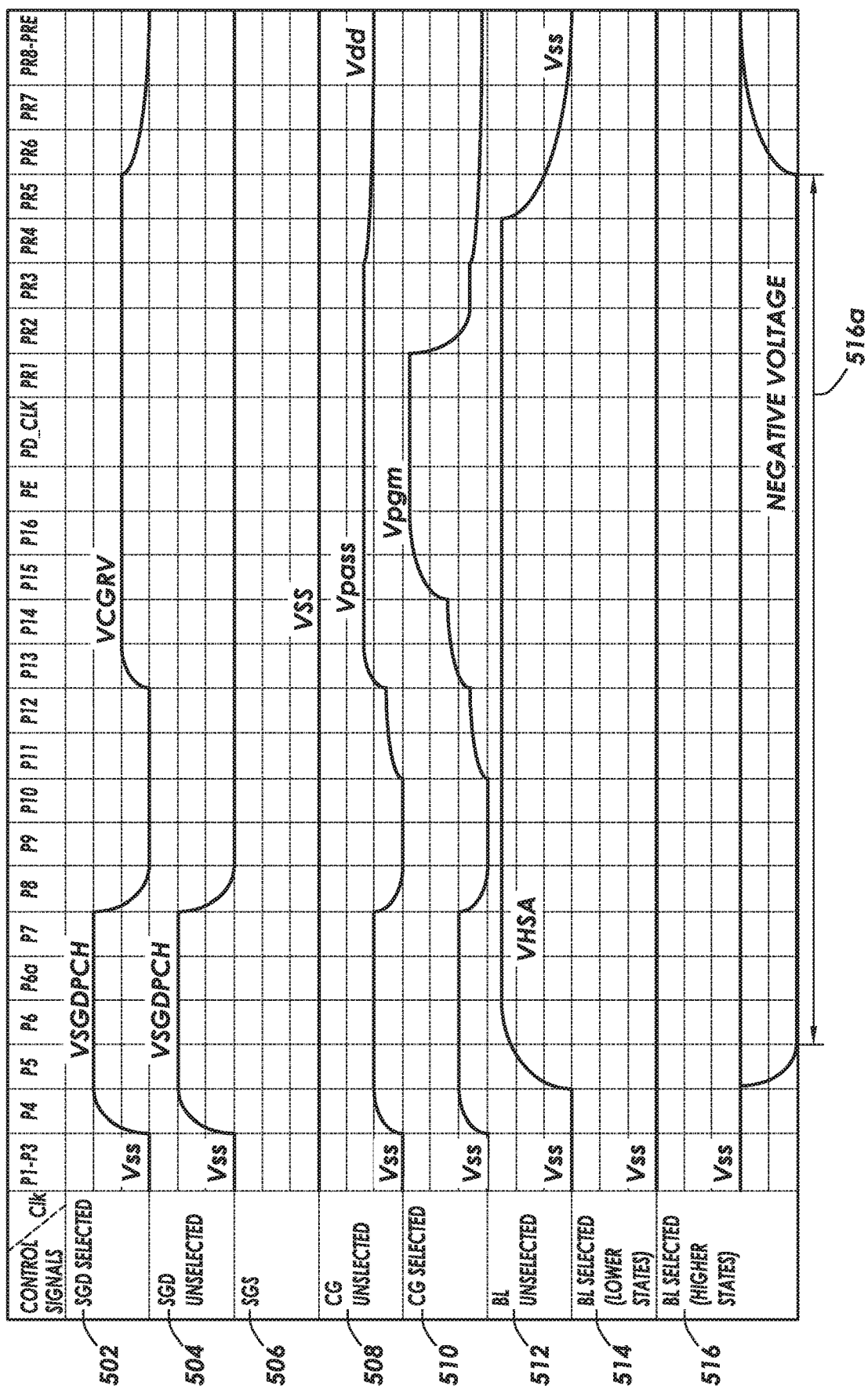
FIG. 5 illustrates a plot capturing various voltage levels applied during a program loop, in accordance with some embodiments.

The FIG. 5 illustrates a plot that captures various voltage levels applied during various stages of the program loop. Specifically, FIG. 5 illustrates voltage levels applied to: a selected select gate drain "SGD" 502, an unselected SGD 504, select gate source "SGS" 506, an unselected control gate "CG" 508, a selected CG 510, an unselected bit line "BL" 512, a selected BL 514, and a selected BL 516.

Between bit lines 514 and 516, the bit line 514 is coupled to a memory cell programmed to a lower state (e.g., a lower state is programmed uses fewer program loops), while the bit line 516 is coupled to a memory cell programmed to a higher state (e.g., a higher state is programmed using more program loops). In this example, lower states can include the states "1" through "7", while the higher states includes the states "8" through "15".

During the example program loop, the voltage levels on the selected and unselected SGDs 502 and 504 can range between Vss, VSGDPCH, and VCGRV. As used herein, Vss refers to a voltage level provided by a ground pin of a positive supply voltage. In some examples, Vss is equal to a ground. In other examples, Vss is equal to a floating ground. In other examples Vss is equal to zero voltages. As used herein, Vss is as non-negative voltage that includes zero voltages. Throughout the example program loop in FIG. 5, Vss is coupled to the SGS 506.

Still referring to FIG. 5, various voltage levels are coupled to the control gates of selected and unselected memory cells. As used herein, an unselected memory cell is one which is not programmed during the example program loop. In contrast, a selected memory cell is one that is being programmed during the example program loop.

Regarding an unselected memory cell, the corresponding control gate of an unselected memory cell (unselected CG 508) is initially at a voltage value of Vss. During the example program loop of FIG. 5, the voltage value of the unselected CG 508 progresses to a Vpass level and then the voltage level of the unselected CG 508 gradually drops to Vdd. Regarding a selected memory cell, the corresponding control gate of a selected memory cell (selected CG 510) is initially at a voltage value of Vss. During the example program loop of FIG. 5, the voltage value of the selected CG 510 progressed to a Vpgm voltage level and gradually drops back to Vss by the end of the program loop. In various embodiments a programming pulse may apply a voltage value of Vpgm.

Of note, to implement concurrent programming, the bit lines of selected memory cells receive either a voltage value of Vss or a negative voltage value. As described herein, the voltage value Vss is any non-negative voltage value including zero voltages. The negative voltage value is a voltage value below Vss, and as also described herein is provided using tripe-well technology. Furthermore, concurrent programming references programming two or more memory cells at the same time. Alternatively, concurrent programming references programming two more memory cells to different states, using the same programming pulse or Vpgm level.

During the example program loop in FIG. 5, the bit line of a selected memory cell that will be programmed to a lower state (e.g., a state needing fewer program loops as described in FIG. 4b) receives the voltage value of Vss. The bit line of a selected memory cell that will be programmed to a lower state is represented by BL selected 514.

In contrast, the bit line of a selected memory cell that will be programmed to a higher state (e.g., a state needing more program loops as described in FIG. 4b) receives a negative voltage value. The negative voltage value is applied for the duration 516a. In one example, the duration 516a encompasses a majority of the program loop duration. In the example shown in FIG. 5, the duration 516a spans from P6 to PR5. Stated alternatively, the duration 516a is larger than the duration during which Vpgm is applied to the CG of the selected cell during the program loop.

Thus, for a memory cell that is being programmed to a higher state, more voltage is applied during the example program loop. For the memory cell being programmed to a lower state, the voltage value of Vss is applied during the example program loop in FIG. 5. Accordingly, in FIG. 5, during the example program loop, two memory states can be programmed. The first memory state is a lower state of the memory cell (e.g., first memory cell), where a voltage level on the bit line of the first memory cell is Vss while the control gate of the first memory cell receives a voltage value of Vpgm. The second memory state is a higher state (e.g., second memory cell), where a voltage level on the bit line of the second memory cell is a negative voltage while the control gate of the second memory cell receives a voltage value of Vpgm. The second memory cell receives a higher voltage during the example program loop.

Although the example in FIG. 5 illustrates a method for programming two states concurrently during one program loop, of note, the methods described herein are not limited to programming only two states concurrently. Different negative voltages can be applied to different bit lines such that more than two states are programmed concurrently. For example, given a memory that includes memory cells that can be programmed to fifteen different states, it is possible that all fifteen states could be programmed concurrently using the methods described herein. For example, one of the states (e.g., state "1") may be programmed using the voltage value Vss, while fourteen different negative voltage values may be used to program the fourteen other states during one program loop.

Accordingly, concurrent programming occurs by applying the same programming pulse or Vpgm level to different memory cells, where the different memory cells are programmed to different states. During the concurrent programming, although the same voltage level Vpgm is applied, different memory states are programmed by varying the magnitude of voltage that is applied to the different memory cells. In the example provided herein, the magnitude of voltage is varied by varying the voltage applied to respective bit lines. In particular, where one bit line receives a Vss or non-negative voltage value, another bit line receives a negative voltage value.

Figure 6A:
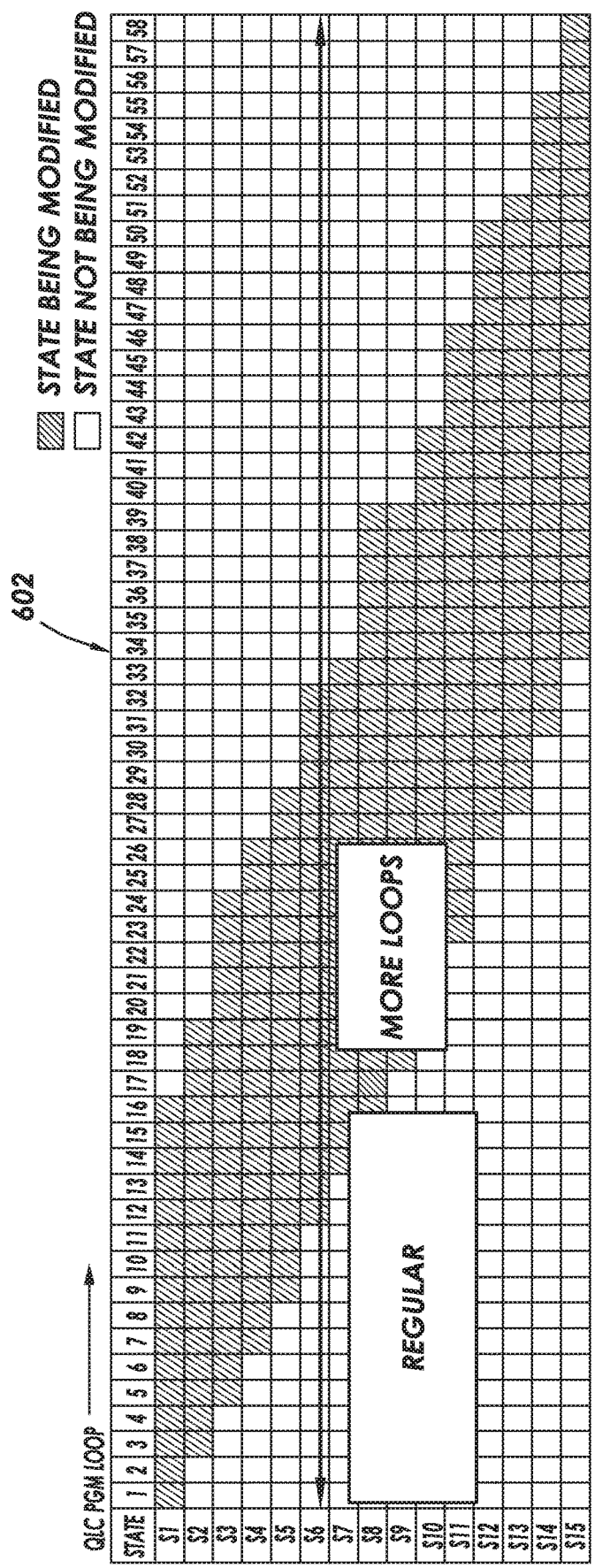
FIG. 6a illustrates a chart associated with programming memory cells, in accordance with some embodiments.

FIG. 6a illustrates a chart 602 that demonstrates a number of program loops that may be used to program a memory having quad-level cells, where respective quad-level cells can be programmed to fifteen different states. The chart 602 is the same as the chart described in FIG. 4b.

FIG. 6b illustrates a chart 604 that demonstrates a number of program loops used when memory cells are programmed concurrently—e.g., as described in FIG. 5. The chart 604 illustrates the number of program loops used when memory cells are programmed concurrently—e.g., as described in FIG. 5. Similar to the chart 602, chart 604 captures a number of program loops along the top row 606, and respective states along the first column 608.

As illustrated in the chart 604, when a memory is programmed using concurrent programming as described herein, a controller may use fewer program loops than if the memory is programmed without using concurrent programming. In the example provided in the chart 604, a controller concurrently programs two different memory cells to two different memory state during the first program loop. The example provided in the chart 604 illustrates that the memory states "1" and "8" may be programmed using the first program loop.

As described previously with regards to FIG. 5, the memory states are programmed concurrently using two different voltage values that are applied to different bit lines. For example, the lower states (e.g., "1" through "7") may be programmed such that respective bit lines receive a non-negative voltage—e.g., Vss including zero. The higher states (e.g., "8" through "15") may be programmed such that respective bit lines receive a negative voltage. Thus, two different memory states may be programmed using the same programming pulse (Vpgm). The levels of voltages applied during concurrent programming are illustrated by graphs 610 and 612 in FIG. 6b.

As illustrated in the graph 610 in FIG. 6b, the lower states are programmed with a zero voltage applied to respective bit lines, while the graph 612 illustrates the higher states are programmed with a negative voltage applied to the respective bit lines. Given the same programming pulse (e.g., voltage level of Vpgm), the difference between Vpgm and zero voltages has a magnitude 614, while the difference between Vpgm and negative voltages has a magnitude 616. As the magnitude 616 is greater than the magnitude 614, a greater amount of voltage is applied during a respective program loop to the memory cells being programmed to a higher state.

Accordingly, during concurrent programming, although the same voltage level Vpgm is applied, different memory states are programmed by varying the magnitude of voltage that is applied to the different memory cells. In the example provided herein, the magnitude of voltage is varied by varying the voltage applied to respective bit lines. In particular, where one bit line receives a Vss or non-negative voltage value, another bit line receives a negative voltage value.

In the example provided in the chart 604, the memory state "1" may take up to the first sixteen program loops, depending on the programming speed of individual cells. For the memory state "8", a controller may apply up to the first twenty four program loops before the individual cells are verified as programmed to the memory state "8".

In the example provided in the chart 604 (FIG. 6b), due to the memory cells being concurrently programmed, a controller begins programming higher states sooner than if the controller were not programming memory cells concurrently. For example, the controller begins programming memory cells to the state "8" with the first program loop. Whereas, in the chart 602 (FIG. 6a), the controller would begin programming memory cells to the state "8" with the sixteenth program loop. As another example, the controller begins programming memory cells to the state "15" using the nineteenth program loop when programming memory cells concurrently (chart 604, FIG. 6b). In contrast, as illustrated in the chart 602 (FIG. 6a), the controller would begin programming memory cells to the state "15" during the thirty-fourth program loop.

The number of program loops and the program loop during which a controller begins programming a certain state is not meant to be limiting. The charts 602 and 604 are illustrated to demonstrate the shortened programming period associated with concurrent programming.

FIG. 7 illustrates a plot that captures voltage levels applied during a program loop in which a quick-pass write is implemented. As used herein, a quick-pass write references an operation used to tighten a distribution of programmed cells.

FIG. 7 illustrates voltage levels applied to a bit line coupled to a memory cell that is programmed to a lower state, and a bit line coupled to a memory cell concurrently programmed to a higher state. The voltage value applied to a bit line coupled to a memory cell that is programmed to a lower state (e.g., BL selected 702), initially begins at Vss and then transitions to a quick pass write (QPW) voltage level. Vss and the QPW voltage level are both non-negative voltages. In this example, the QPW voltage level is higher than Vss.

The voltage value applied to a bit line coupled to a memory cell that is programmed to a higher state (e.g., BL selected 704), initially beings at Vss, then drops to a negative voltage value and then transitions to a negative quick pass write (QPW) voltage level. The negative voltage value and the negative quick pass write are both negative voltage values. In this example, the negative quick pass write voltage level is between the negative voltage value and zero voltages. Both the negative voltage value and the negative QPW voltage values are implemented using triple-well technology.

Figure 8:
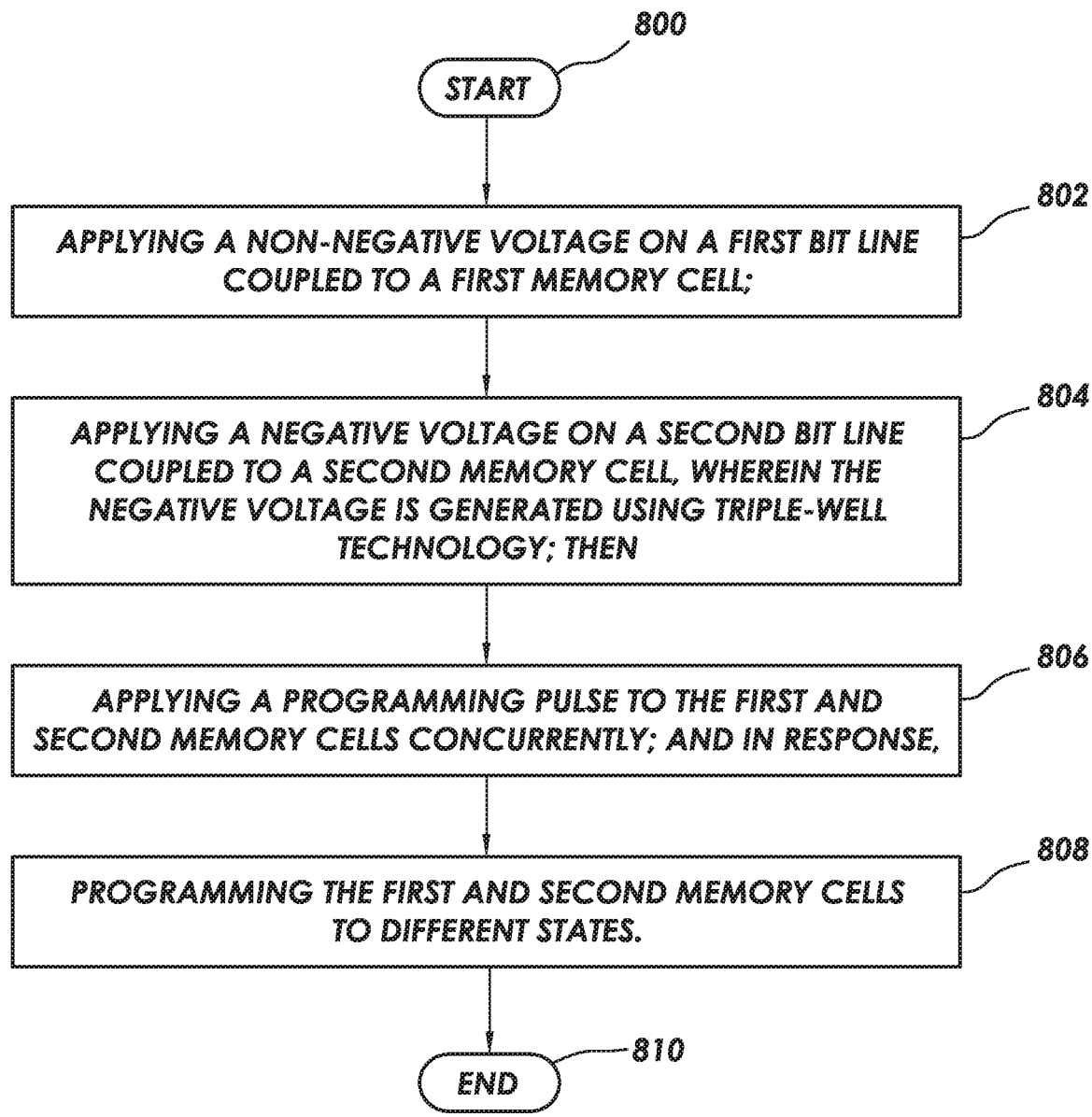
FIG. 8 illustrates a method in accordance with some embodiments.

FIG. 8 shows a method in accordance with at least some embodiments. In particular, the method is performed at a memory system (e.g., the storage system 102) and includes applying a non-negative voltage on a first bit line coupled to a first memory cell (block 802); applying a negative voltage on a second bit line coupled to a second memory cell, wherein the negative voltage is generated using triple-well technology (block 804); then applying a programming pulse to the first and second memory cells concurrently (block 806); and in response, programming the first and second memory cells to different states (block 808). Thereafter the method ends (block 810).

Figure 9:
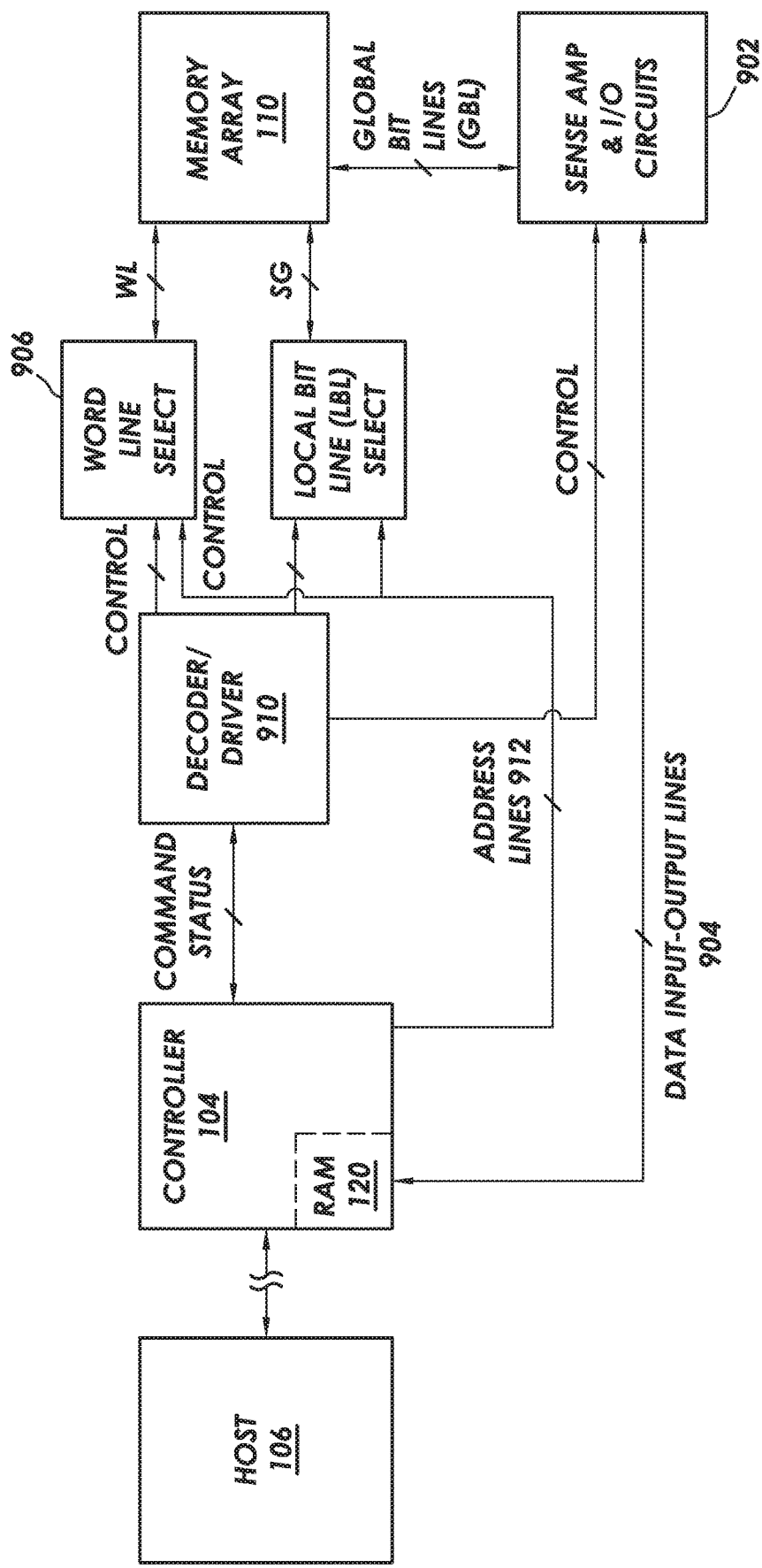
FIG. 9 illustrates a block diagram of an example memory system, in accordance with some embodiments.

FIG. 9 shows in block diagram form, an illustrative memory system that can use the three-dimensional memory 110. Sense amplifier and I/O circuits 902 are connected to provide (during programming) and receive (during reading) analog electrical quantities in parallel over the global bit-lines $GBL_x$ (FIG. 1) that are representative of data stored in addressed memory elements $M_{zxy}$. The circuits 902 contain sense amplifiers for converting these electrical quantities into digital data values during reading, which digital values are then conveyed over lines 904 to the memory controller 104.

Conversely, data to be programmed into the memory 110 are sent by the controller 104 to the sense amplifier and I/O circuits 902, which then programs that data into addressed memory elements by placing proper voltages on the global bit lines $GBL_x$. The memory elements are addressed for reading or programming by voltages placed on the word-lines $WL_{zy}$ and select gate control lines $SG_y$ by respective word-line select circuits 906 and local bit line circuits 908.

In the memory 110, the memory elements disposed between a selected word-line and any of the local bit lines $LBL_{xy}$—connected at one instance through the select devices $Q_{xy}$ to the global bit lines $GBL_x$—may be addressed for programming or reading by appropriate voltages being applied through the select circuits 906 and 908.

The controller 104 receives data from and sends data to the host 106. Commands, status signals and addresses of data being read or programmed are exchanged between the controller 104 and host 106.

The controller 104 conveys to decoder/driver circuits 910 commands received from the host. Similarly, status signals generated by the memory system are communicated to the controller 104 from the circuits 910. The circuit 910 can be simple logic circuits in the case where the controller controls nearly all of the memory operations, or can include a state machine to control at least some of the repetitive memory operations necessary to carry out given commands. Control signals resulting from decoding commands are applied from the circuits 910 to the word-line select circuits 906, local bit line select circuits 908, and sense amplifier and I/O circuits 902.

Also connected to the circuits 906 and 908 are address lines 912 from the controller that carry physical addresses of memory elements to be accessed within the array 110 in order to carry out a command from the host. The physical addresses correspond to logical addresses received from the host 106, where the physical addresses are converted to logical addresses by the controller 104 and/or the decoder/driver 910.

As a result, the circuits 908 partially address the designated storage elements within the array 110 by placing proper voltages on the control elements of the select devices $Q_{xy}$ to connect selected local bit lines ($LBL_{xy}$) with the global bit lines ($GBL_x$). The addressing is completed by the circuits 906 applying proper voltages to the word-lines $WL_{zy}$ of the array.

Although the memory system of FIG. 9 utilizes the three-dimensional memory 110 of FIG. 1, the system is not limited to use of only that array architecture. A given memory system may alternatively combine this type of memory with other types including flash memory, such as flash having a NAND memory cell array architecture, a magnetic disk drive, or some other type of memory. The other type of memory may have its own controller or may in some cases share the controller 104 with the three-dimensional memory 110, for example if there is some compatibility between the two types of memory at an operational level.

The above discussion is meant to be illustrative of the principles and various embodiments described herein. Numerous variations and modifications will become apparent to those skilled in the art once the above disclosure is fully appreciated. For example, although a controller 104 has been described as performing the methods described above, any processor executing software within a host system can perform the methods described above without departing from the scope of this disclosure. In particular, the methods and techniques described herein as performed in the controller, may also be performed in a host. Furthermore, the methods and concepts disclosed herein may be applied to other types of persistent memories other than flash. It is intended that the following claims be interpreted to embrace all such variations and modifications.

What is claimed is:

1. A method of concurrently programming a memory, comprising:
    applying a non-negative voltage on a first bit line coupled to first memory cell;
    applying a negative voltage on a second bit line coupled to the second memory cell, wherein the negative voltage is generated using triple-well technology; then
    applying a programming pulse to the first and second memory cells concurrently and over a duration of time and wherein the negative voltage is applied to the second bit line during the duration of time and the non-negative voltage is applied to the first bit line during the duration of time; and in response,
    programming the first and second memory cells to different states.

2. The method of claim 1, wherein the non-negative voltage is provided by a ground pin of a positive supply voltage.

3. The method of claim 1, further comprising:
    applying a quick pass write operation to the first and second memory cells, by:
        applying a quick pass write voltage to the first bit line coupled to the first memory cell, wherein the quick pass write voltage is higher than the non-negative voltage;
        applying a negative quick pass write voltage to the second bit line coupled to the first memory cell, wherein the negative quick pass write voltage is between the negative voltage and the non-negative voltage, and wherein the negative quick pass write voltage is generated using triple-well technology.

4. The method of claim 1, further comprising:
    applying a quick pass write operation to the first and second memory cells during a second duration of time by:
        applying a quick pass write voltage to the first bit line coupled to the first memory cell, wherein the quick pass write voltage is higher than the non-negative voltage;
        applying a negative quick pass write voltage to the second bit line coupled to the first memory cell, wherein the negative quick pass write voltage is between the negative voltage and the non-negative voltage, and wherein the negative quick pass write voltage is generated using triple-well technology.

5. The method of claim 1, wherein the memory stores states that correspond to negative threshold voltages and additional states that correspond to positive voltages.

6. The method of claim 1, wherein two or more memory cells are programmed concurrently.

7. A memory controller, comprising:
    a first terminal coupled to a memory array;
    the memory controller configured to:
        apply a non-negative voltage on a first bit line coupled to a first memory cell in the memory array;
        apply a negative voltage on a second bit line coupled to a second memory cell in the memory array;
        apply a programming pulse to the first and second memory cells concurrently over a duration of time and wherein the negative voltage is applied to the second bit line during the duration of time and the non-negative voltage is applied to the first bit line during the duration of time; and in response,
        program the first and second memory cells to different states.

8. The memory controller of claim 7, wherein the non-negative voltage is provided by a ground pin of a positive supply voltage.

9. The memory controller of claim 7, wherein the memory controller is further configured to:
    apply a quick pass write operation to the first and second memory cells during a second duration of time, wherein the memory controller is further configured to:
        apply a quick pass write voltage to the first bit line coupled to the first memory cell, wherein the quick pass write voltage is higher than the non-negative voltage;
        apply a negative quick pass write voltage to the second bit line coupled to the first memory cell, wherein the negative quick pass write voltage is between the negative voltage and the non-negative voltage, and wherein the negative quick pass write voltage is generated using triple-well technology.

10. The memory controller of claim 7, wherein the memory array stores states that correspond to negative threshold voltages and additional states that correspond to positive voltages.

11. The memory controller of claim 7, wherein two or more memory cells are programmed concurrently.

12. A non-volatile storage system, configured to concurrently program memory cells, comprising:
    a memory array including a first and second memory cells;

a controller coupled to the memory array, wherein the controller is configured to:
- apply a non-negative voltage on a first bit line coupled to a first memory cell;
- apply a negative voltage on a second bit line coupled to the second memory cell, wherein the negative voltage is generated using triple-well technology; then
- apply a programming pulse to the first and second memory cells concurrently over a duration of time, wherein the negative voltage is applied to the second bit line during the duration of time and the non-negative voltage is applied to the first bit line during the duration of time; and in response,
- program the first and second memory cells to different states.

13. The non-volatile storage system of claim 12, wherein the non-negative voltage is provided by a ground pin of a positive supply voltage.

14. The non-volatile storage system of claim 12, wherein the controller is further configured to:
apply a quick pass write operation to the first and second memory cells, wherein the controller is further configured to:
- apply a quick pass write voltage to the first bit line coupled to the first memory cell, wherein the quick pass write voltage is higher than the non-negative voltage;
- apply a negative quick pass write voltage to the second bit line coupled to the first memory cell, wherein the negative quick pass write voltage is between the negative voltage and the non-negative voltage, and wherein the negative quick pass write voltage is generated using triple-well technology.

15. The non-volatile storage system of claim 12, wherein the controller is further configured to:
apply a quick pass write operation to the first and second memory cells during a second duration of time, wherein the controller is further configured to:
- apply a quick pass write voltage to the first bit line coupled to the first memory cell, wherein the quick pass write voltage is higher than the non-negative voltage;
- apply a negative quick pass write voltage to the second bit line coupled to the first memory cell, wherein the negative quick pass write voltage is between the negative voltage and the non-negative voltage, and wherein the negative quick pass write voltage is generated using triple-well technology.

16. The non-volatile storage system of claim 12, wherein the memory array stores states that correspond to negative threshold voltages and additional states that correspond to positive voltages.

17. The non-volatile storage system of claim 12, wherein two or more memory cells are programmed concurrently.

* * * * *